US012672273B2

(12) United States Patent
Zhang et al.

(10) Patent No.: US 12,672,273 B2
(45) Date of Patent: Jun. 30, 2026

(54) IMPLANT FOR TRANSISTOR BITLINE CONTACT AND JUNCTION FORMATION

(71) Applicant: Applied Materials, Inc., Santa Clara, CA (US)

(72) Inventors: Yan Zhang, Westford, MA (US); Johannes M. Van Meer, Middleton, MA (US); Kyu-Ha Shim, Andover, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 369 days.

(21) Appl. No.: 18/534,410

(22) Filed: Dec. 8, 2023

(65) Prior Publication Data

US 2025/0194072 A1 Jun. 12, 2025

(51) Int. Cl.
H10B 12/00 (2023.01)
H10D 30/01 (2025.01)

(52) U.S. Cl.
CPC ........... H10B 12/05 (2023.02); H10B 12/485 (2023.02); H10D 30/025 (2025.01)

(58) Field of Classification Search
CPC .... H10B 12/05; H10B 12/485; H10B 12/482; H10B 12/053; H10D 30/025; H10P 30/00; H10P 30/20; H10P 30/202; H10P 30/204; H10P 30/206; H10P 30/208; H10P 30/21; H10P 30/212; H10P 30/218; H10P 30/28
See application file for complete search history.

(56) References Cited

U.S. PATENT DOCUMENTS

2021/0320202 A1* 10/2021 Hsieh ................... H10D 30/668
2022/0282366 A1* 9/2022 Weimer ................. C23C 16/26

* cited by examiner

*Primary Examiner* — Sonya McCall-Shepard
(74) *Attorney, Agent, or Firm* — KDW Firm PLLC

(57) ABSTRACT

Approaches herein provide devices, systems, and methods of transistor patterning using a frontside implant plus epitaxial process to form a graded junction having a high surface doping concentration for a vertical contact transistor bitline. One method may include delivering ions into a front side of a substrate of a transistor to form a graded junction in the substrate, wherein the substrate is maintained at a temperature greater than 100° C. while the ions are delivered into the substrate, and thermally treating the graded junction. The method may further include forming, after the graded junction is thermally treated, an epitaxial layer over the graded junction, forming a plurality of gates in the epitaxial layer, and processing a backside of the substrate to remove the substrate to the graded junction following formation of the plurality of gates.

20 Claims, 8 Drawing Sheets

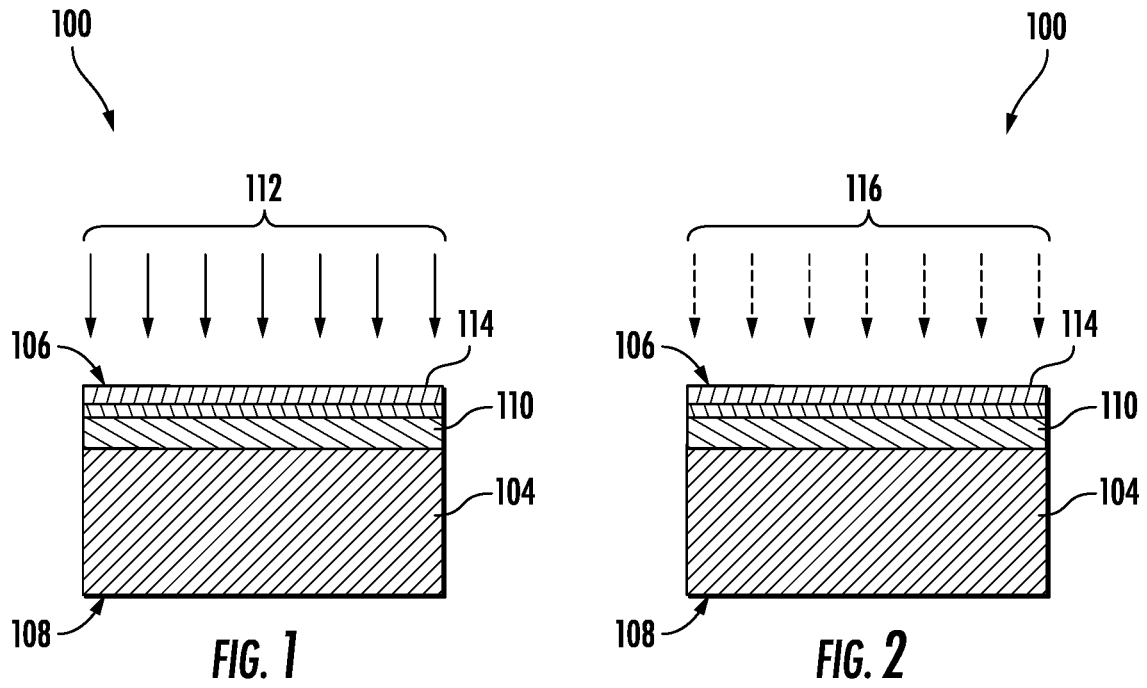
*FIG. 1*
*FIG. 2*
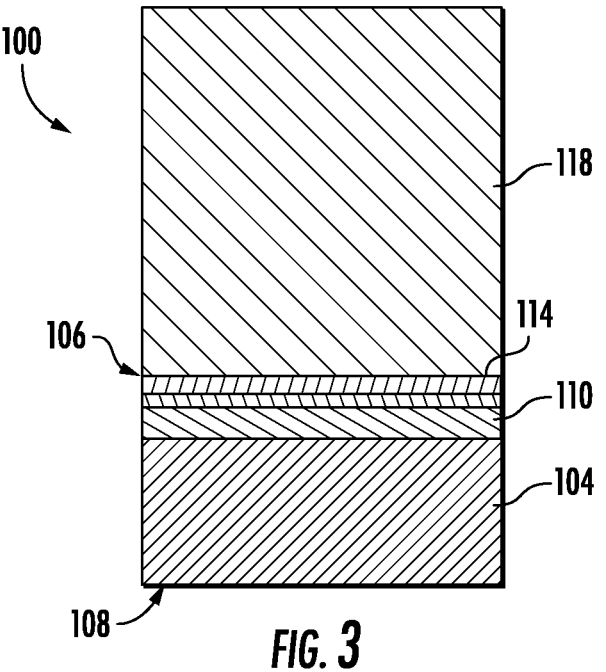
*FIG. 3*

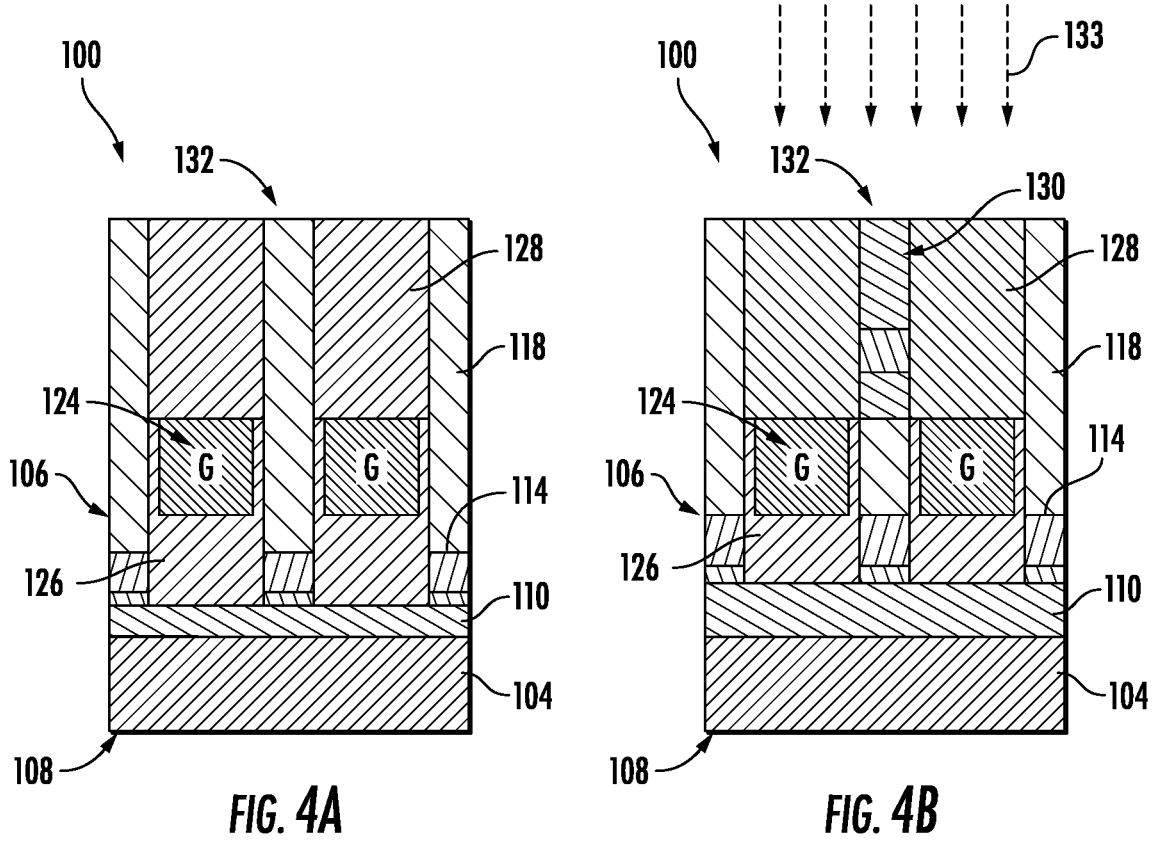
FIG. 4A                          FIG. 4B
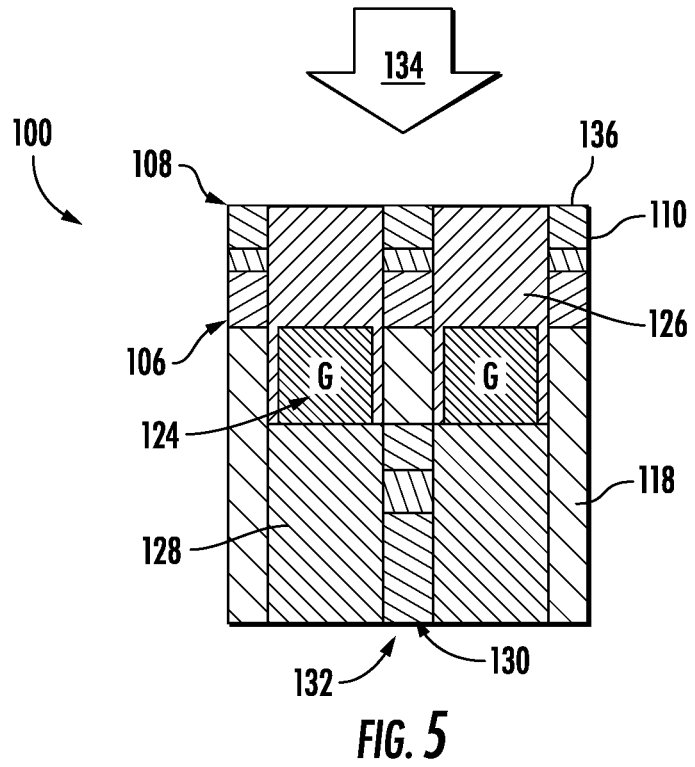
FIG. 5

100

108    140    136

110

126

106

124    G    G

118

128

132    130

200

214

206    207

204

208

IMPLANT FOR TRANSISTOR BITLINE CONTACT AND JUNCTION FORMATION

FIELD OF THE DISCLOSURE

The present embodiments relate to transistor patterning, and more particularly, to transistor patterning using a frontside implant plus epitaxial process to form a graded junction having a high surface doping concentration for a vertical contact transistor for DRAM.

BACKGROUND OF THE DISCLOSURE

Forming graded junctions and low contact resistance for bitline of vertical contact transistor (VCT) is a high-value problem for memory devices. Current solutions are all performed as part of a wafer backside routine. As a result, lower temperatures must be maintained throughout to avoid damaging the backside, leading to ineffective dopant activation and diffusion.

Accordingly, improved approaches are needed for forming bitline of vertical contact transistors.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include delivering ions into a front side of a substrate of a transistor to form a graded junction in the substrate, wherein the substrate is maintained at a temperature greater than 400° C. while the ions are delivered into the substrate, and thermally treating the graded junction. The method may further include forming, after the graded junction is thermally treated, an epitaxial layer over the graded junction, forming a plurality of gates in the epitaxial layer, and processing a backside of the substrate to remove the substrate to the graded junction following formation of the plurality of gates.

In another aspect, a method of forming a vertical contact transistor may include delivering ions into a front side of a substrate of the vertical contact transistor to form a graded junction in the substrate, wherein the substrate is maintained at a temperature greater than 400° C. while the ions are delivered into the substrate. The method may further include thermally treating the graded junction, forming an epitaxial layer over the graded junction, forming, after the graded junction is thermally treated, a plurality of gates in the epitaxial layer, flipping the substrate over after the plurality of gates are formed in the epitaxial layer, and planarizing a backside of the substrate to remove the substrate to the graded junction following formation of the plurality of gates.

In yet another aspect, a system for forming a vertical contact transistor may include a first process chamber including a substrate of the vertical contact transistor, wherein the substrate is maintained at a temperature greater than 400° C., and an ion beam implanter within the first process chamber, wherein the ion beam implanter is operable to deliver ions into a front side of the substrate to form a graded junction in the substrate. The system may further include one or more additional process chambers operable for performing the following: thermally treating the graded junction; forming an epitaxial layer over the graded junction; forming, after the graded junction is thermally treated, a plurality of gates in the epitaxial layer; flipping the substrate over after the plurality of gates are formed in the epitaxial layer; and planarizing a backside of the substrate to remove the substrate to the graded junction following formation of the plurality of gates.

BRIEF DESCRIPTION OF THE DRAWINGS

The accompanying drawings illustrate exemplary approaches of the disclosure, including the practical application of the principles thereof, as follows:

FIG. 1 illustrates a side view of a substrate of a device during an ion treatment, according to embodiments of the present disclosure;

FIG. 2 illustrates a side view of the device during a thermal treatment, according to embodiments of the present disclosure;

FIG. 3 illustrates a side view of the device following formation of an epitaxial layer, according to embodiments of the present disclosure;

FIGS. 4A-4B illustrate side views of the device following a plurality of front side processes, according to embodiments of the present disclosure;

FIG. 5 illustrates a side view of the device after the device has been flipped and the substrate removed, according to embodiments of the present disclosure;

Figure 6:
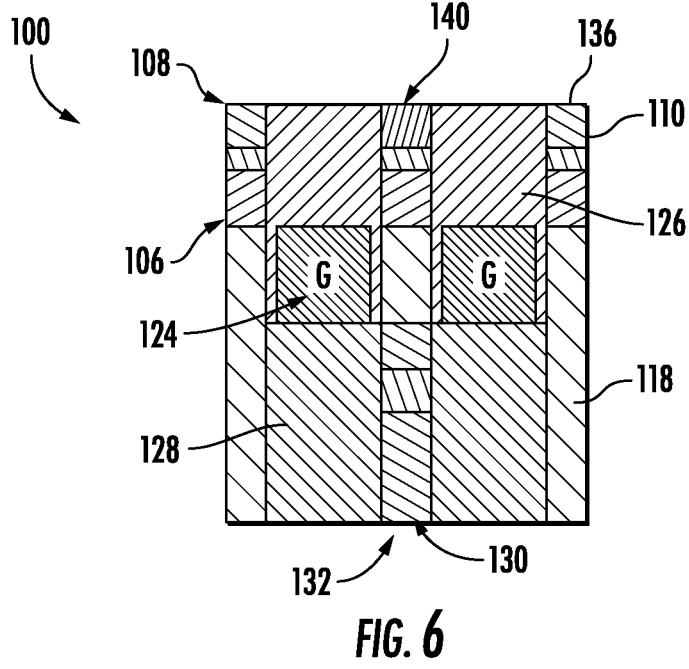
FIG. 6 illustrates a side view of the device following formation of an optional doped layer in the graded junction, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments of the present disclosure provide a novel solution for vertical contact transistor (VCT) for DRAM applications in which a hot implant is performed to a wafer frontside to reduce damage and to form a graded junction for bitline contact of the VCT. Following the implant, a thermal process (e.g., anneal) may be performed along with one or more epitaxial layering steps, prior to proceeding with standard front side processing. Subsequent thermal steps, e.g., a laser spike anneal, may be used to activate and diffuse the implanted dopants. Thus, no extra annealing step may be required. An optional SiGe epi can be used as an etch stop layer that improves backside substrate thinning process variability and uniformity.

With reference to FIG. 1, an approach for forming a portion of a transistor or semiconductor device (hereinafter "device") 100 according to one or more embodiments will be described. The device 100 may include a substrate base 104 having a front side 106 and a backside 108. As further shown, a graded junction 110 may be formed in the substrate base 104 by delivering ions 112 into the front side 106 of the substrate base 104. More specifically, in one embodiment, the ions 112 may include arsenic, which is delivered into an upper surface 114 of the substrate base 104 to dope the upper portion of the substrate base 104 while the substrate base 104 is maintained at a high temperature, such as above 100° C. Although other species may be used, arsenic may be selected given its low diffusivity and high activation in Si. In some embodiments, the implant may be performed while the substrate base 104 is held at a temperature above 400° C., which can help reduce damage to the substrate base 104 to prepare the substrate base 104 for subsequent epi growth. It will be appreciated that the implant energy, dose, and temperature are all variable.

According to an exemplary embodiment, the substrate base 104 may be a bulk semiconductor substrate. As used herein, the term "bulk semiconductor substrate" refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped poly-silicon, doped or undoped silicon wafers, patterned or non-patterned wafers, doped silicon, germanium, gallium arsenide, or other suitable semiconducting materials. In some embodiments, the semiconductor material is silicon (Si). In one or more embodiments, the substrate base 104 may include a semiconductor material, e.g., silicon (Si), carbon (C), germanium (Ge), silicon germanium (SiGe), germanium tin (GeSn), other semiconductor materials, or any combination thereof. In one or more embodiments, the substrate base 104 may include one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the semiconductor material may be a doped material, such as n-doped silicon (n-Si), or p-doped silicon (p-Si). In some embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the dopant is selected from one or more of boron (B), gallium (Ga), phosphorus (P), arsenic (As), other semiconductor dopants, or combinations thereof.

As shown in FIG. 2, a thermal process 116 may then be performed following the ion implant. In some embodiments, the thermal process 116 is an anneal, or multiple anneal steps, which helps mitigate damage from the implant of the ions 112. It will be appreciated that the anneal temperature may vary, as desired. For example, the thermal process 116 may be performed at temperatures between approximately 900 C and 1100 C. The thermal process 116 is useful for mitigating implantation generated damage, which is required for subsequent epi growth. In some embodiments, the doping concentration is greatest at the upper surface 114 and lessens as the depth within the graded junction 110 increases.

FIG. 3 demonstrates the device 100 following formation of an epitaxial layer 118. In some embodiments, the epitaxial layer 118 is an undoped layer of Si, which is epitaxially grown directly atop the graded junction 110. The material of the substrate base 104 and the epitaxial layer 118 may be the same, e.g., Si.

FIG. 4A demonstrates the device 100 following a plurality of front side processes. For example, trenches may be formed through the epitaxial layer 118 and through the graded junction 110, and an oxide 126 may be formed therein. One or more gates 124 may then be formed within the oxide 126, and a nitride 128 may be formed atop the gates 124.

Furthermore, as shown in FIG. 4B, a storage node contact (SNC) 132 may then be formed, along with a second graded junction 130 above the plurality of gates 124. More specifically, the second graded junction 130 may be formed in the epitaxial layer 118, between the nitride 128, using an ion implant and high thermal treatment (e.g., anneal) 133. The high thermal budgets used in SNC 132 formation and other process steps can further drive dopants into the epitaxial layer 118 to form the second graded junction 130 and activate the dopant(s). That is, after the SNC high thermal treatment 133, dopants (e.g., As) from the graded junction 110 will diffuse upwards into the Si epitaxial layer 118 and form the bitline graded junction 130.

As shown in FIG. 5, the device 100 may then be flipped or inverted, and one or more backside processes may be performed. More specifically, a planarization process 134 (e.g., chemical mechanical planarization) may be performed to remove the substrate base 104 selective to an edge 136 of the graded junction 110 and the oxide 126 for a bitline contact. In other embodiments, the substrate base 104 is only partially removed. Backside processing may then continue, as known.

In some embodiments, as shown in FIG. 6, a doped layer 140 may be formed in the graded junction 110, between the oxide 126. The doped layer 140 is formed following the planarization process 134, and may be a doped poly or low-temp epi deposition performed as part of the backside process to further reduce bitline contact resistance.

Figure 7:
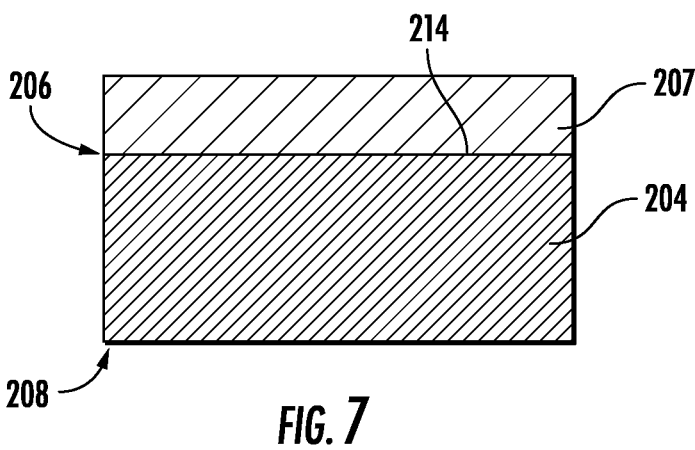
FIG. 7 illustrates a side view of a substrate and an etch stop layer of a device, according to embodiments of the present disclosure.

With reference to FIG. 7, an approach for forming a portion of another transistor or semiconductor device (hereinafter "device") 200 according to one or more embodiments will be described. The device 200 may be the same or similar in many aspects to the device 100 describe above. As such, only certain features of device 200 may hereinafter be described for the sake of brevity. As shown, the device 200 includes a substrate base 204 having a front side 206 and a backside 208.

As further shown, an etch stop layer 207 may be formed atop an upper surface 214 of the substrate base 104. Although non-limiting, the etch stop layer 207 may be a layer of SiGe, which is epitaxially grown over the substrate base 204. As will be described further below, the SiGe epi can be used as an etch stop layer during a backside Si substrate thinning process to improve variability and uniformity.

Figure 8:
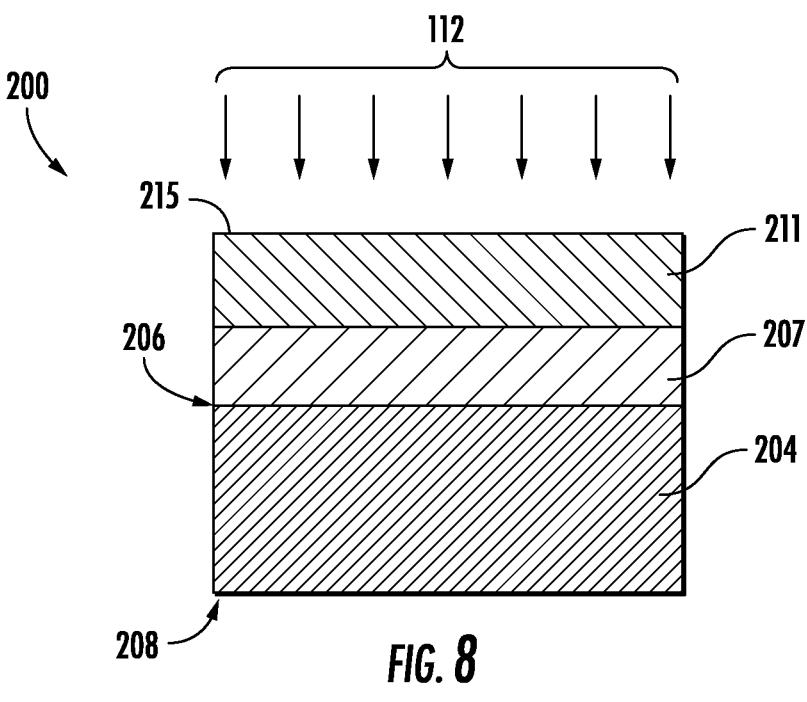
FIG. 8 illustrates a side view of the device following formation of a base epitaxial layer over the etch stop layer and during an ion treatment, according to embodiments of the present disclosure.

As shown in FIG. 8, a base epitaxial layer 211 may then be formed over the etch stop layer 207. In some embodiments, the base epitaxial layer 211 may be a layer of Si, which is epitaxially grown directly atop the etch stop layer 207. A thickness of the base epitaxial layer 211 may vary, and can be used as a knob for junction and contact control.

As further shown, ions 212 may be delivered into the front side 206 of the substrate base 204. More specifically, in one embodiment, the ions 212 may include arsenic, which is delivered into an upper surface 215 of the base epitaxial layer 211 to dope the upper portion of the base epitaxial layer 211. In some embodiments, the ions 212 are implanted while the device 200 maintained at a high temperature, such as above 400° C. It will be appreciated that the implant energy, dose, and temperature are all variable. Although not shown, a thermal process may also be performed following the ion implant to repair damage from the ions 212.

Figure 9:
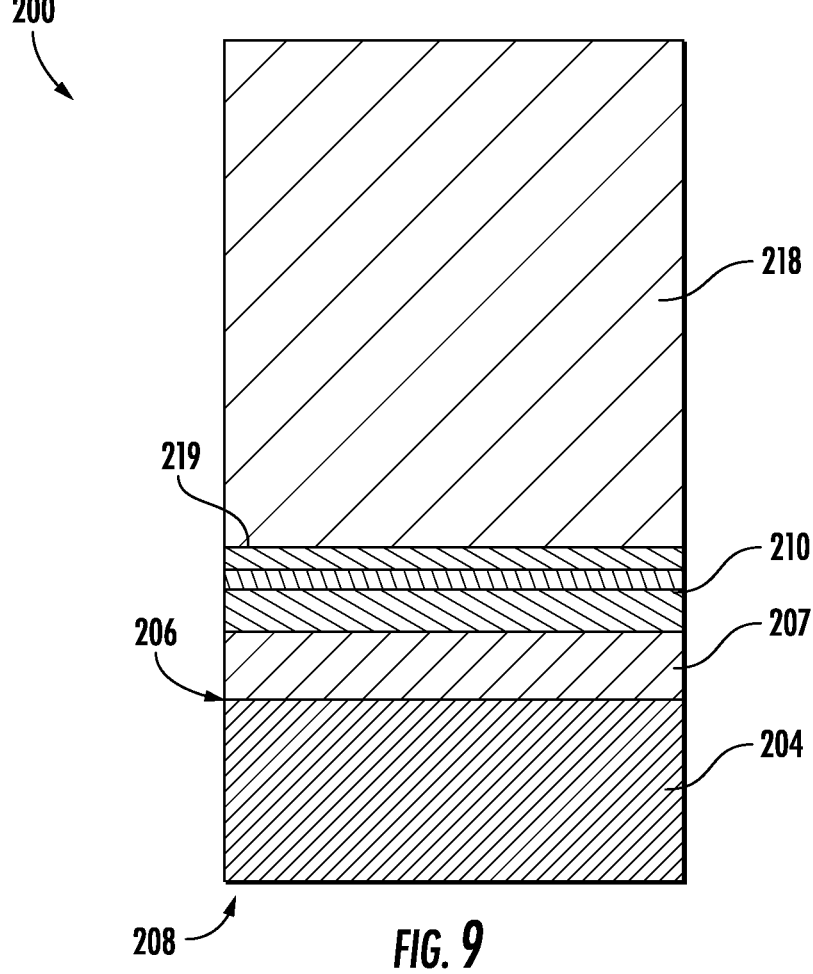
FIG. 9 illustrates a side view of the device following formation of an epitaxial layer over the base epitaxial layer, according to embodiments of the present disclosure.

As a result of the ion implant and thermal processes, a graded junction 210 may be formed in the device 200, above the etch stop layer 207, as shown in FIG. 9. An epitaxial layer 218 may then be formed over the etch stop layer 207. In some embodiments, the epitaxial layer 218 is a layer of un-doped Si, which is grown directly atop an upper surface 219 of the graded junction 210. Although non-limiting, the material of the substrate base 204 and the epitaxial layer 218 may be the same, e.g., Si.

Figure 10:
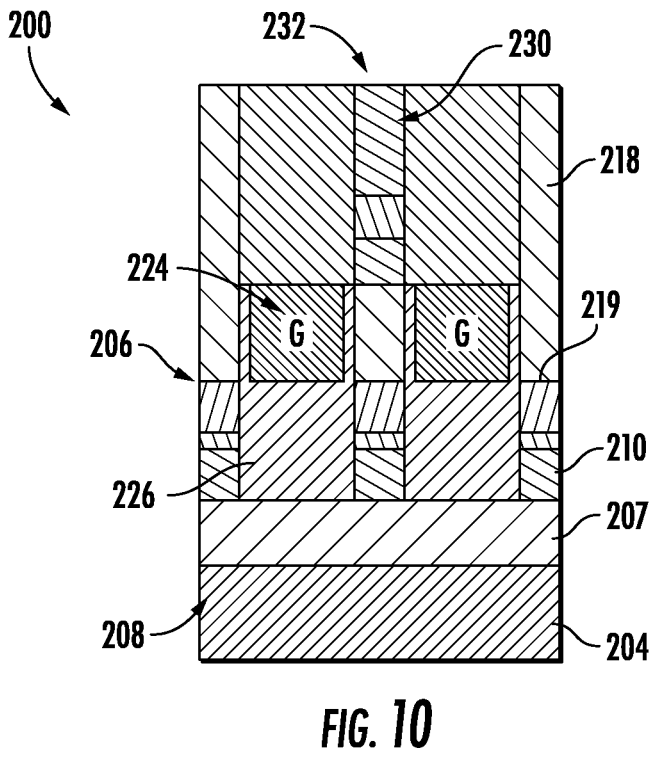
FIG. 10 illustrates a side view of the device following a plurality of front side processes, according to embodiments of the present disclosure.

FIG. 10 demonstrates the device 200 following a plurality of front side processes. For example, trenches may be formed through the epitaxial layer 218 and through the graded junction 210, and an oxide 226 may be formed therein. Furthermore, a storage node contact (SNC) 232 may then be formed, along with a second graded junction 230, above a plurality of gates 224. More specifically, the second graded junction 230 may be formed in the epitaxial layer 218 using an ion implant and thermal treatment. The high thermal budgets used in SNC 232 formation and other process steps can further drive dopants into the epitaxial layer 218 to form the second graded junction 230 and activate the dopant(s).

Figure 11:
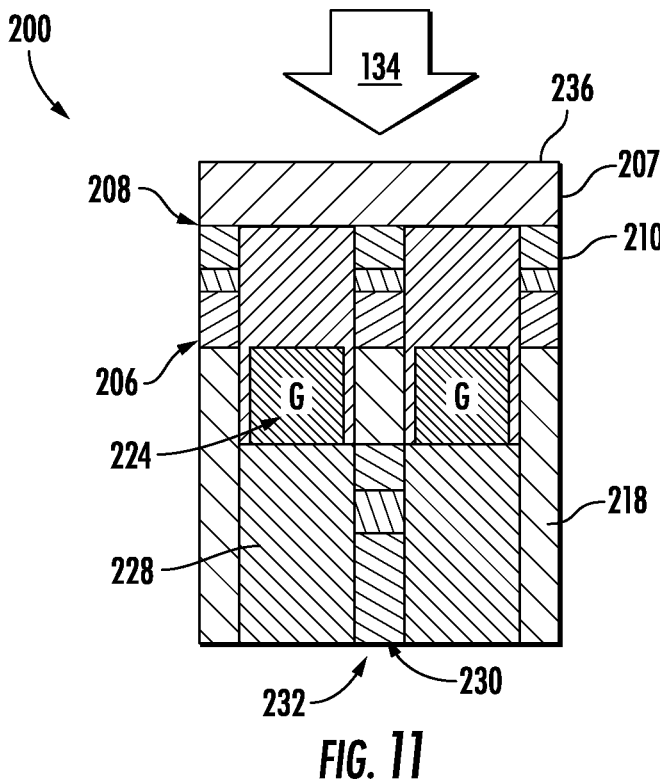
FIG. 11 illustrates a side view of the device after the device has been flipped and the substrate removed selective to the etch stop layer, according to embodiments of the present disclosure.

As shown in FIG. 11, the device 200 may then be flipped or inverted, and one or more backside processes may be performed. More specifically, a planarization process 234 (e.g., chemical mechanical planarization) may be performed to remove the substrate base 204 selective to an edge 236 of the etch stop layer 207. Backside processing may then continue, as known.

Figure 12:
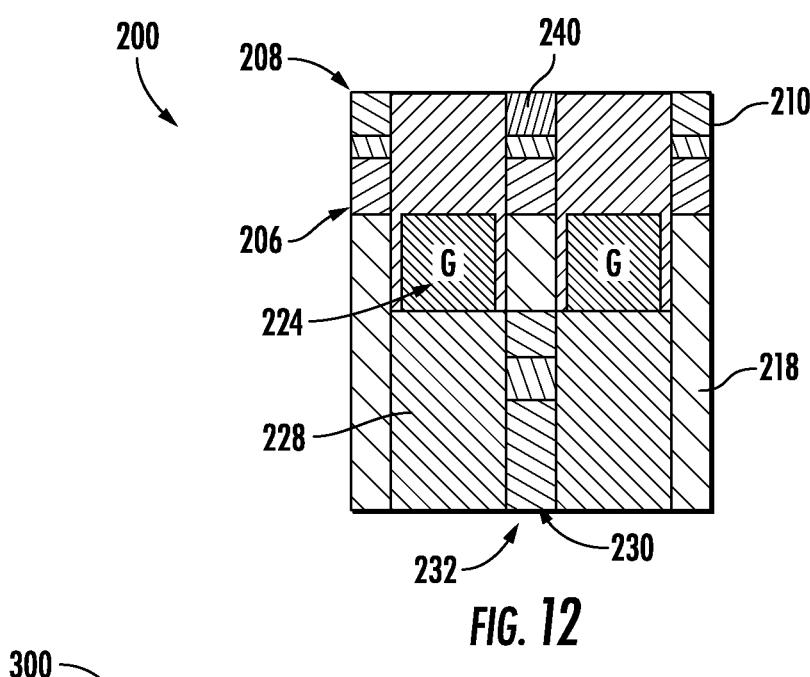
FIG. 12 illustrates a side view of the device following formation of an optional doped layer in the graded junction, according to embodiments of the present disclosure.

In some embodiments, as shown in FIG. 12, the etch stop layer 207 may be removed, and a doped layer 240 may be formed in the graded junction 210. The doped layer 240 is formed following the planarization process 234, and may be a doped poly or low-temp epi deposition performed as part of the backside process to further reduce bitline contact resistance.

Figure 13:
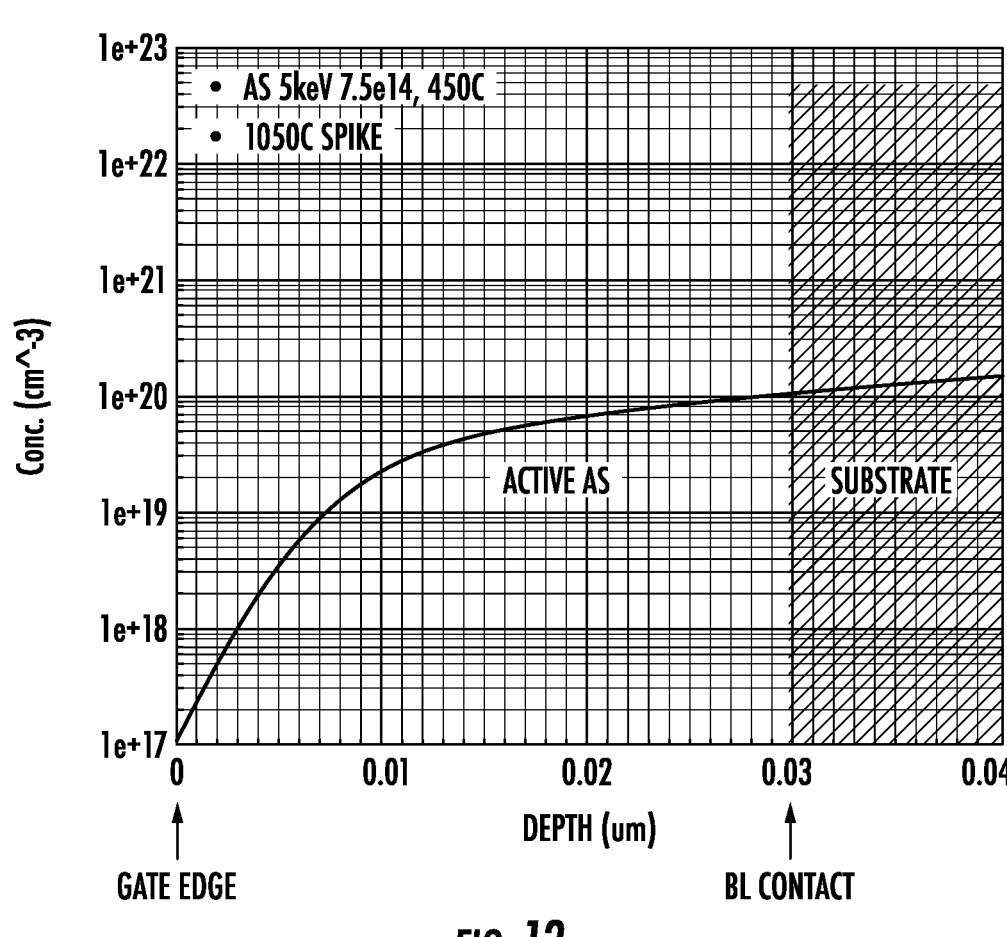
FIGS. 13-14 are graphs illustrating an active arsenic profile after one or more implant and annealing processes, according to embodiments of the present disclosure.
Figure 14:
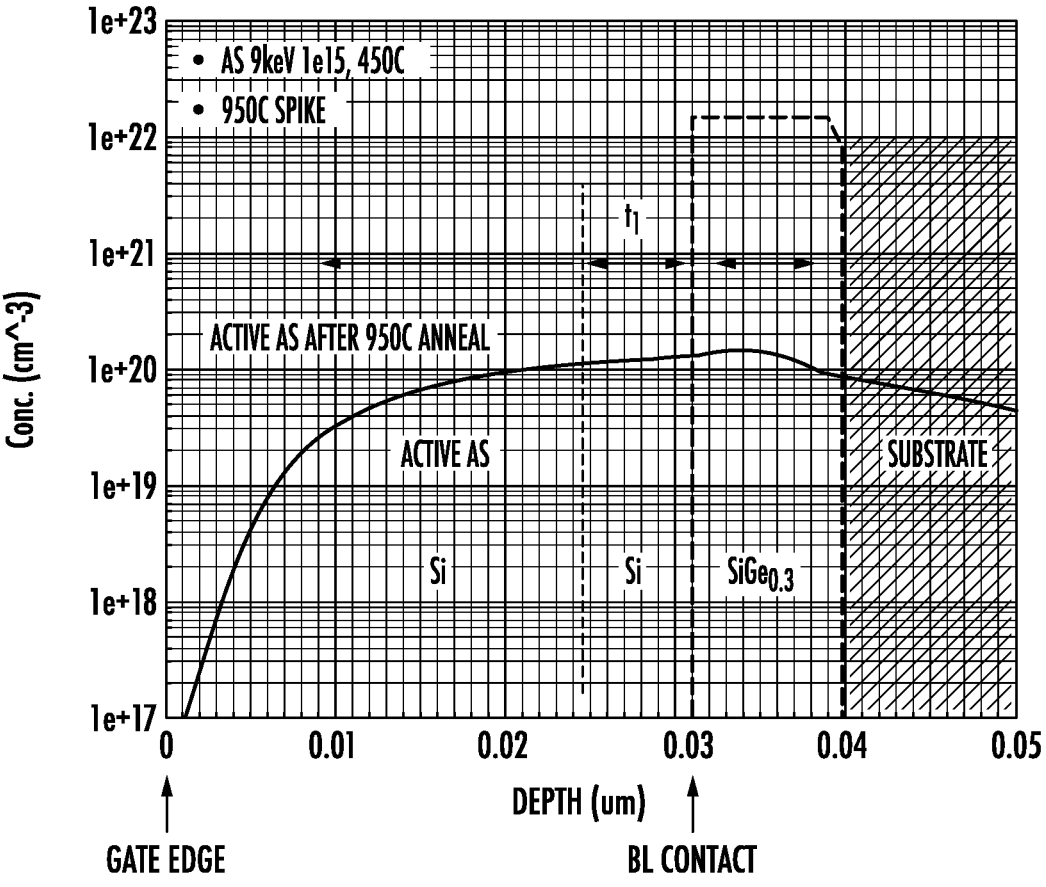

FIGS. 13-14 are graphs illustrating an active arsenic profile after one or more annealing processes, according to embodiments of the present disclosure. More specifically, graph 300 of FIG. 13 demonstrates dopant concentration vs. depth according to the processes of FIGS. 1-4. In this example, the ion implant may be an arsenic ion implant delivered at 5 keV, 7.5e14, and at a temperature of approximately 450° C. As shown, the active arsenic profile after the SNC anneal, e.g., a laser spike at a temperature of approximately 1050° C., demonstrates a concentration of $1e17 \, cm^{-3}$ at an edge of the gates 124 and a concentration greater than $1e20 \, cm^{-3}$ at the BL contact for a graded junction 110 having a depth/thickness of approximately 30 nm.

Meanwhile, graph 301 of FIG. 14 demonstrates dopant concentration vs. depth according to the processes of FIGS. 7-10. In this example, the ion implant may be an arsenic ion implant delivered at 9 keV, 1e15, and at a temperature of approximately 450° C. As shown, the active arsenic profile after an SNC anneal, e.g., a laser spike at a temperature of approximately 950° C., with a graded junction depth/thickness of approximately 30 nm, has a concentration of $1e17 \, cm^{-3}$ at an edge of the gates 124 and a concentration greater than $1e20 \, cm^{-3}$ at the BL contact.

Figure 15:
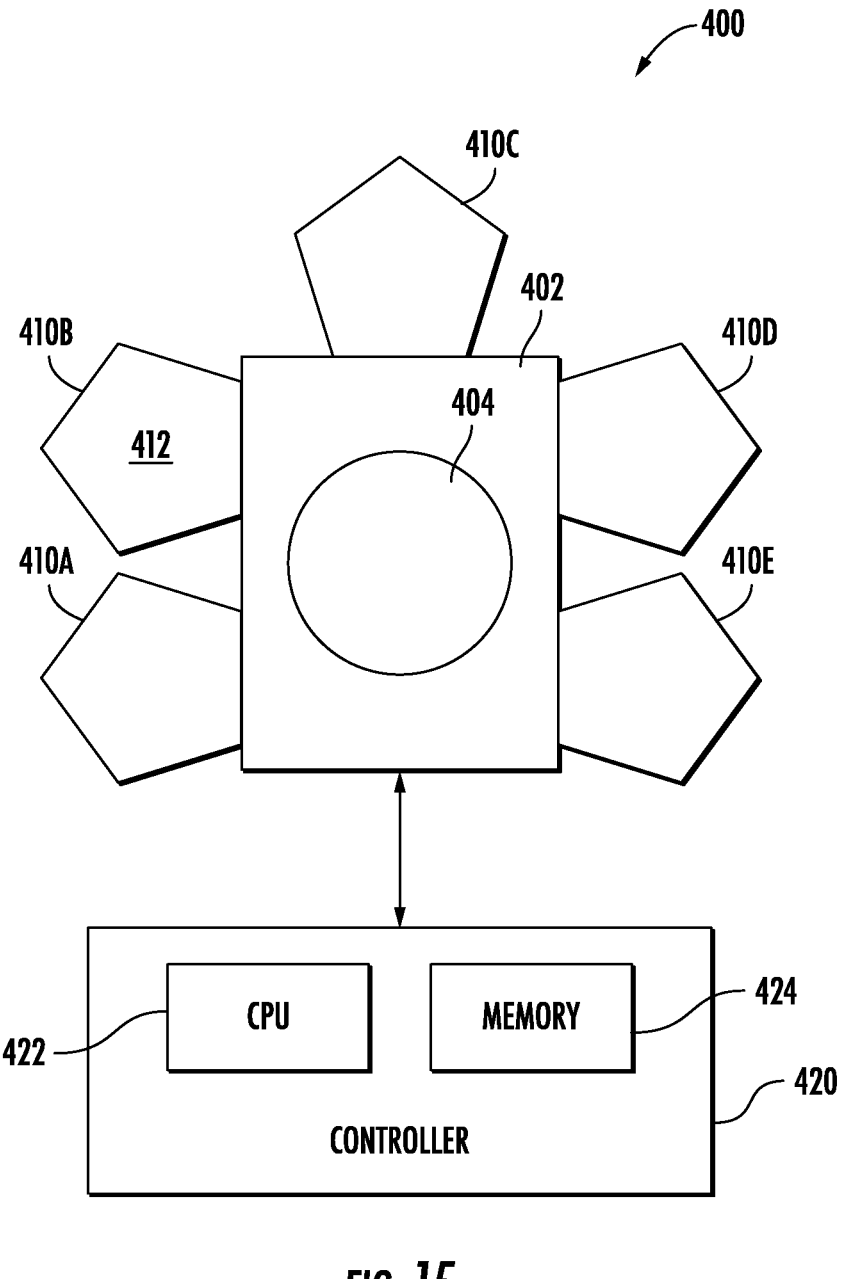
FIG. 15 illustrates a perspective view of an example processing system, according to embodiments of the present disclosure.

FIG. 15 shows a schematic of an example system/apparatus 400 according to embodiments of the disclosure. Operation of the system 400 will be described with reference to the device 100 and/or the device 200. In some embodiments, the system 400 may be a cluster tool operable to perform processes necessary to form the device 100 and the device 200 described herein. Although non-limiting, the system 400 may include at least one central transfer station/chamber 402 and one or more robots 404 within the transfer station/chamber 402, wherein the robot 404 is operable to move a robot blade and a wafer to and from each of a plurality of processing chambers 410A-410E connected with, or positioned adjacent to, the transfer station/chamber 402. In some embodiments, the system 400 may include any variety of suitable chambers including, but not limited to, a deposition chamber 410A, an ion implant chamber 410B, an etch chamber 410C, and a thermal processing chamber 410D. The particular arrangement of process chambers and components can be varied depending on the cluster tool, and should not be taken as limiting the scope of the disclosure. For example, in alternative embodiments, multiple deposition chamber and/or multiple etch chambers may be present in the system 400. In another example, one or more of the deposition chambers may include multiple process regions within a same chamber, which permits a common supply of gases, common pressure control, and common process gas exhaust/pumping. Modular design of the system enables rapid conversion from one configuration to any other.

In some embodiments, the deposition chamber 410A may be used to house a substrate, while the ion implant chamber 410B may house an ion beam implanter 412 operable to deliver ions into a front side of the substrate to form a graded junction in the substrate. After the graded junction is formed, the deposition chamber 410A may again be used to form one or more epitaxial layers over the graded junction. The deposition chamber 410A may be further used to form an etch stop layer (e.g., SiGe) over an upper surface of the substrate, and to grow a base epitaxial layer over the etch stop layer.

The etch chamber 410C may be used to form a plurality of trenches in the epitaxial layer(s) and the graded junction, and the deposition chamber 410A may again be used to form a plurality of gates. The etch chamber 410C may be further used during a planarizing process (e.g., CMP) to the backside of the substrate for the purpose of remove or thinning the substrate.

The thermal processing chamber 410D may be used to perform one or more annealing processes to the device(s), such as an anneal to the graded junction and an anneal following formation of a storage node contact and a second graded junction. The thermal processing chamber 410D may also be used to perform the thermal treatment to drive dopants into the epitaxial layer to form the second graded junction and to activate the dopant(s). Following the anneal to the graded junction, the graded junction may have a high surface doping concentration (e.g., approximately 1e20 $cm^{-3}$) along an upper surface thereof.

A system controller 420 is in communication with the robot 404, the transfer station/chamber 402, and the plurality of processing chambers 410A-410E. The system controller 420 can be any suitable component that can control the processing chambers 410A-410E and robot(s) 404, as well as the processes occurring within the process chambers 410A-410E. For example, the system controller 420 can be a computer including a central processing unit 422, memory 424, suitable circuits/logic/instructions, and storage.

Processes or instructions may generally be stored in the memory 424 of the system controller 420 as a software routine that, when executed by the processor 422, causes the processing chambers 410A-410E to perform processes of the present disclosure. The software routine may also be stored and/or executed by a second processor (not shown) that is remotely located from the hardware being controlled by the processor 422. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 422, transforms the general-purpose computer into a specific purpose computer (controller) that controls the chamber operation such that the processes are performed.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   delivering ions into a front side of a substrate of a transistor to form a graded junction in the substrate, wherein the substrate is maintained at a temperature greater than 100° C. while the ions are delivered into the substrate;
   thermally treating the graded junction;
   forming, after the graded junction is thermally treated, an epitaxial layer over the graded junction;
   forming a plurality of gates in the epitaxial layer; and
   processing a backside of the substrate to remove the substrate to the graded junction following formation of the plurality of gates.

2. The method of claim 1, further comprising forming a storage node contact and a second graded junction above the plurality of gates.

3. The method of claim 2, further comprising annealing the transistor following formation of the storage node contact and the second graded junction.

4. The method of claim 1, further comprising forming a doped layer in the graded junction, wherein the doped layer is deposited after the backside of the substrate is processed to remove the substrate.

5. The method of claim 1, further comprising:

forming an etch stop layer over an upper surface of the substrate; and growing a base epitaxial layer over the etch stop layer, wherein the ions are delivered into the base epitaxial layer to form the graded junction, and wherein the epitaxial layer is formed over the base epitaxial layer.

6. The method of claim 1, further comprising maintaining the substrate at a temperature greater than 400° C. while the ions are delivered into the substrate.

7. The method of claim 1, further comprising flipping the substrate over after the plurality of gates are formed in the epitaxial layer.

8. The method of claim 1, wherein processing the backside of the substrate comprises planarizing the substrate.

9. The method of claim 1, wherein delivering ions into the front side of the substrate comprises delivering arsenic ions into an upper surface of the substrate.

10. A method of forming a vertical contact transistor, the method comprising:

delivering ions into a front side of a substrate of the vertical contact transistor to form a graded junction in the substrate, wherein the substrate is maintained at a temperature greater than 400° C. while the ions are delivered into the substrate;

thermally treating the graded junction;

forming an epitaxial layer over the graded junction;

forming, after the graded junction is thermally treated, a plurality of gates in the epitaxial layer;

flipping the substrate over after the plurality of gates are formed in the epitaxial layer; and planarizing a backside of the substrate to remove the substrate after the substrate is flipped.

11. The method of claim 10, further comprising:

forming a storage node contact and a second graded junction above the plurality of gates; and annealing the transistor following formation of the storage node contact and the second graded junction.

12. The method of claim 10, further comprising forming a doped layer in the graded junction, wherein the doped layer is formed after the backside of the substrate is planarized to remove the substrate.

13. The method of claim 10, further comprising:

forming an etch stop layer over an upper surface of the substrate; and growing a base epitaxial layer over the etch stop layer, wherein the ions are delivered into the base epitaxial layer to form the graded junction, wherein the epitaxial layer is formed over the base epitaxial layer, and wherein planarizing the backside of the substrate comprises removing the substrate selective to the etch stop layer.

14. The method of claim 10, further comprising maintaining the substrate at a temperature greater than 450° C. while the ions are delivered into the substrate.

15. The method of claim 10, wherein delivering ions into the front side of the substrate comprises delivering arsenic ions into an upper surface of the substrate.

16. A system for forming a vertical contact transistor, the system comprising:

a first process chamber including a substrate of the vertical contact transistor, wherein the substrate is maintained at a temperature greater than 400° C.; and an ion beam implanter within the first process chamber, wherein the ion beam implanter is operable to deliver ions into a front side of the substrate to form a graded junction in the substrate; and one or more additional process chambers operable for performing the following:

thermally treating the graded junction;

forming an epitaxial layer over the graded junction;

forming, after the graded junction is thermally treated, a plurality of gates in the epitaxial layer;

flipping the substrate over after the plurality of gates are formed in the epitaxial layer; and planarizing a backside of the substrate to remove the substrate after the substrate is flipped.

17. The system of claim 16, wherein the one or more additional process chambers are further operable for:

forming a storage node contact and a second graded junction above the plurality of gates; and annealing the transistor following formation of the storage node contact and the second graded junction, wherein the substrate is flipped over after the annealing.

18. The system of claim 16, wherein the one or more additional process chambers are further operable for forming a doped layer in the graded junction, wherein the doped layer is deposited after the backside of the substrate is planarized to remove the substrate.

19. The system of claim 16, wherein the one or more additional process chambers are further operable for:

forming an etch stop layer over an upper surface of the substrate; and growing a base epitaxial layer over the etch stop layer, wherein the ions are delivered into the base epitaxial layer to form the graded junction, and wherein the epitaxial layer is formed over the base epitaxial layer.

20. The system of claim 16, wherein the substrate is maintained at a temperature greater than 450° C. while the ions are delivered into the substrate, and wherein delivering ions into the front side of the substrate comprises delivering arsenic ions into an upper surface of the substrate.

* * * * *